(12) United States Patent
Heng et al.

(10) Patent No.: US 9,647,682 B1
(45) Date of Patent: May 9, 2017

(54) DATA COMPRESSION SYSTEM AND METHOD

(71) Applicant: Kabushiki Kaisha Toshiba, Minato-ku (JP)

(72) Inventors: Tse Kai Heng, Fuchu (JP); Atsushi Matsumura, Yokohama (JP); Nakaba Kogure, Zama (JP); Tomoya Kodama, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/260,942

(22) Filed: Sep. 9, 2016

(30) Foreign Application Priority Data

Mar. 17, 2016 (JP) .................... 2016-054119

(51) Int. Cl.
H03M 7/00 (2006.01)
H03M 7/30 (2006.01)
H03M 7/42 (2006.01)

(52) U.S. Cl.
CPC .......... H03M 7/3088 (2013.01); H03M 7/42 (2013.01)

(58) Field of Classification Search
CPC .... H03M 7/3088; H03M 7/42; H03M 7/3084; H03M 7/3095
USPC .......................... 341/50, 67, 106, 51, 65, 63
See application file for complete search history.

(56) References Cited

U.S. PATENT DOCUMENTS

| | | | | |
|---|---|---|---|---|
| 5,371,499 A * | 12/1994 | Graybill | ................. | G06T 9/005 341/106 |
| 6,392,568 B1 * | 5/2002 | Cooper | ............... | H03M 7/3088 341/106 |
| 7,548,928 B1 * | 6/2009 | Dean | ................. | G06F 17/30985 |
| 2006/0106870 A1 | 5/2006 | Franaszek et al. | | |
| 2007/0179748 A1 * | 8/2007 | Kanai | ............. | G11B 20/00086 702/187 |
| 2011/0246741 A1 * | 10/2011 | Raymond | ......... | G06F 17/30159 711/170 |
| 2014/0304236 A1 * | 10/2014 | Hachiya | ............ | G06F 17/30949 707/687 |

OTHER PUBLICATIONS

Bharat Sukhwani, et al., "High-Throughput, Lossless Data Compression on FPGAs," IEEE International Symposium on Field-Programmable Custom Computing Machines, IEE Computer Society, (2011), pp. 113-116.

* cited by examiner

Primary Examiner — Peguy Jean Pierre
(74) Attorney, Agent, or Firm — Oblon, McClelland, Maier & Neustadt, L.L.P.

(57) ABSTRACT

A divider divides an input data into a plurality of data blocks. A hash calculator calculates a hash value of each data block. A compression dictionary memory stores a compression dictionary that stores a previous input data and includes a shared dictionary shared by different data lengths. A hash table memory stores a hash table that stores an address representing a storage location of the data block corresponding to the hash value on the compression dictionary for each data block and includes a shared table shared by different data lengths. An address acquirer acquires the address corresponding to the data block based on the hash table. A matcher determines sameness between the previous data block indicated by the address and the new input data. An encoder generates a compressed data that includes matching information and a matched portion is converted to the address.

8 Claims, 13 Drawing Sheets

DATA COMPRESSION SYSTEM AND METHOD

CROSS-REFERENCE TO RELATED APPLICATIONS

This application is based upon and claims the benefit of priority from Japanese Patent Application No. 2016-054119, filed on Mar. 17, 2016; the entire contents of which are incorporated herein by reference.

FIELD

Embodiments described herein relate generally to a data compression system and method.

BACKGROUND

As a data compression technique, there is known a dictionary-type compression method such as LZ78 or LZW.

There is a data compression device which divides an input data into, for example, data blocks having data lengths of 8 bytes, 4 bytes, and 2-bytes and contracts dictionaries corresponding to the data lengths in a nest-shaped hierarchical structure.

High-speed, high-accuracy data compression can be implemented by dividing an input data into data blocks having predetermined data lengths and using dictionaries generated for patterns of the data lengths. In addition, by increasing the number of patterns of the data lengths, it is possible to further improve performance. However, if the number of patterns of the data lengths is increased, the number of dictionaries corresponding to the patterns is increased, and thus, in some cases, a physical storage area required for storing the dictionaries is increased.

DETAILED DESCRIPTION

First Embodiment

Figure 1:
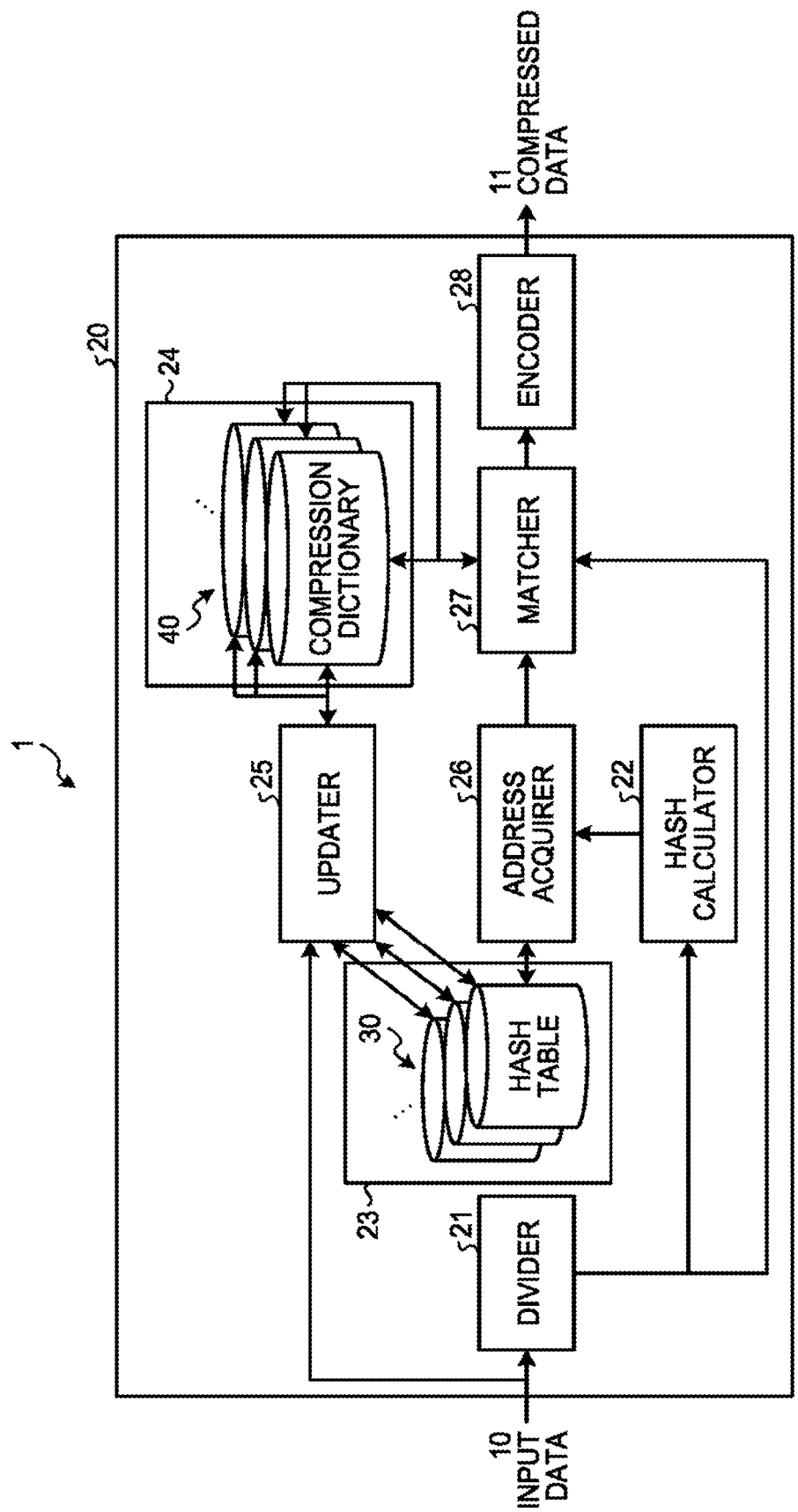
FIG. 1 is a diagram illustrating a configuration of a data compression system according to a first embodiment.

FIG. 1 is diagram illustrating a configuration of a data compression system 1 according to a first embodiment. The data compression system 1 includes a compressor 20 which is input with an input data 10 and outputs a compressed data 11. The compressor 20 is configured to include a divider 21, a hash calculator 22, a hash table memory 23, a compression dictionary memory 24 (first dictionary memory), an updater 25 (first updater), an address acquirer 26, a matcher 27, and an encoder 28.

The data compression system 1 may be configured by combining a CPU (Central Processing Unit) which performs processes according to a program, ROM (Read Only Memory) which stores the program, RAM (Random Access Memory) functioning as a working area, a general-purpose logic IC (Integrated Circuit), and the like.

The divider 21 divides the input data 10 as a compression object into a plurality of data blocks. The plurality of data blocks have different data lengths. The data length may be, for example, 16 bytes, 8 bytes, 4 bytes, 2 bytes, or the like.

The hash calculator 22 calculates a hash value of each data block by using a predetermined hash function.

The compression dictionary memory 24 is a memory which stores a compression dictionary 40 storing a previous input data 10 for each data block. The compression dictionary 40 includes a shared dictionary shared by a plurality of different data lengths. For example, a dictionary corresponding to a data block having a data length of 8 bytes and a dictionary corresponding to a data block having a data length of 16 bytes are formed as one shared dictionary. The compression dictionary 40 is shared by a plurality of data blocks having the same data length. For example, a dictionary which stores a plurality of the data blocks having a data length of 4 bytes is formed as one dictionary.

The hash table memory 23 is a memory which stores a hash table 30 including an address representing a storage location of a data block corresponding to a hash value for each data block. The address specifies a position on the compression dictionary 40 (compression dictionary memory 24). The hash table 30 includes a shared table shared by a plurality of different data lengths. For example, a table storing an address corresponding to a data block having a data length of 8 bytes and a table storing an address corresponding to a data block having a data length of 16 bytes are formed as one shared table. The hash table 30 is shared by a plurality of data blocks having the same data length. For example, a table storing addresses corresponding to a plurality of data blocks having a data length of 4 bytes is formed as one table.

The updater 25 updates the compression dictionary 40 based on a new input data 10 and updates the address of the hash table 30 based on the new input data 10 and the updated compression dictionary 40.

The address acquirer 26 acquires addresses corresponding to the data blocks of the new input data 10 based on the hash table 30.

The matcher 27 determines sameness between a previous data block stored at the storage location on the compression dictionary 40 indicated by the address acquired by the address acquirer 26 and each portion of the new input data 10.

The encoder 28 generates the compressed data 11 by compressing the input data 10. The encoder 28 compresses the input data 10 by converting a matched portion which is a portion of or all of the input data 10 determined that there is sameness to the address. The compressed data 11 includes matching information representing a result of sameness determination and at least one of an address corresponding to a matched portion of the input data 10 and raw data (mismatched portion) of the input data 10. The encoder 28 may output the compressed data 11 as bitstream.

Figure 2:
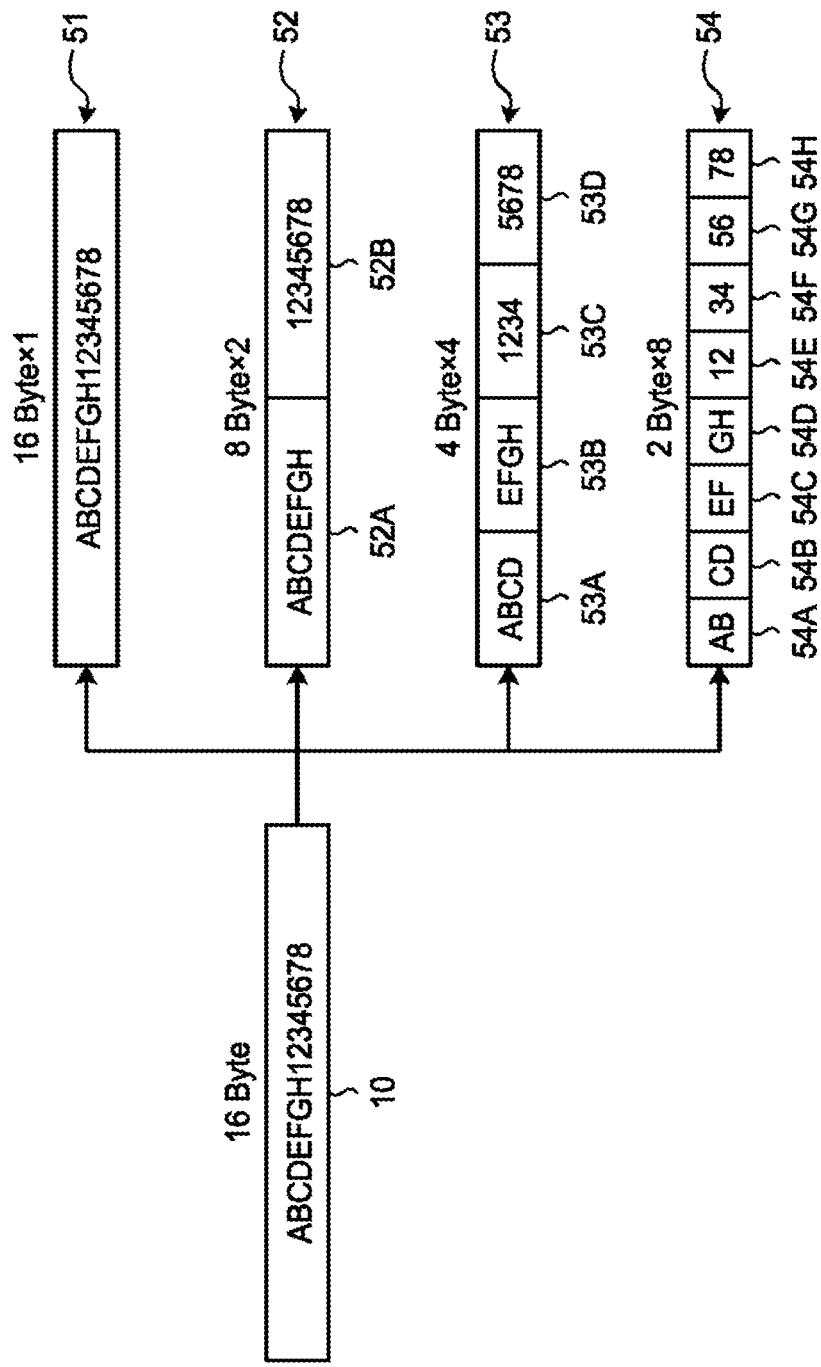
FIG. 2 is a diagram illustrating a configuration of data blocks according to the first embodiment.

FIG. 2 is a diagram illustrating a configuration of data blocks 51 to 54 according to the first embodiment. In the embodiment, the divider 21 generates a plurality (15) of data blocks 51, 52A, 52B, 53A to 53D, and 54A to 54H having four types (16 bytes, 8 bytes, 4 bytes, and 2 bytes) of data lengths from one 16-byte input data 10. More specifically, one 16-byte data block 51, two 8-byte data blocks 52A and 52B, four 4-byte data blocks 53A to 53D, and eight 2-byte data blocks 54A to 54H are generated.

The 16-byte data block 51 has the same data length as the input data 10. The 16-byte data block 51 includes "ABCDEFGH12345678" as the entire content of the input data 10.

The 8-byte data block 52 has a data length of 8 bytes. The divider 21 generates a first 8-byte data block 52A and a second 8-byte data block 52B by dividing the input data 10 into two data blocks. The first 8-byte data block 52A includes "ABCDEFGH" as a portion of the content of the input data 10. The second 8-byte data block 52B includes "12345678" as a portion of the content of the input data 10.

The 4-byte data block 53 has a data length of 4 bytes. The divider 21 generates a first 4-byte data block 53A, a second 4-byte data block 53B, a third 4-byte data block 53C, and a fourth 4-byte data block 53D by dividing the input data 10 into four data blocks. The first 4-byte data block 53A includes "ABCD" as a portion of the content of the input data 10. The second 4-byte data block 53B includes "EFGH" as a portion of the content of the input data 10. The third 4-byte data block 53C includes "1234" as a portion of the content of the input data 10. The fourth 4-byte data block 53D includes "5678" as a portion of the content of the input data 10.

The 2-byte data block 54 has a data length of 2 bytes. The divider 21 generates a first 2-byte data block 54A, a second 2-byte data block 54B, a third 2-byte data block 54C, a fourth 2-byte data block 54D, a fifth 2-byte data block 54E, a sixth 2-byte data block 54F, a seventh 2-byte data block 54G, and an eighth 2-byte data block 54H by dividing the input data 10 into eight data blocks. The first 2-byte data block 54A includes "AB" as a portion of the content of the input data 10. The second 2-byte data block 54B includes "CD" as a portion of the content of the input data 10. The third 2-byte data block 54C includes "EF" as a portion of the content of the input data 10. The fourth 2-byte data block 54D includes "GH" as a portion of the content of the input data 10. The fifth 2-byte data block 54E includes "12" as a portion of the content of the input data 10. The sixth 2-byte data block 54F includes "34" as a portion of the content of the input data 10. The seventh 2-byte data block 54G includes "56" as a portion of the content of the input data 10. The eighth 2-byte data block 54H includes "78" as a portion of the content of the input data 10.

Figure 3:
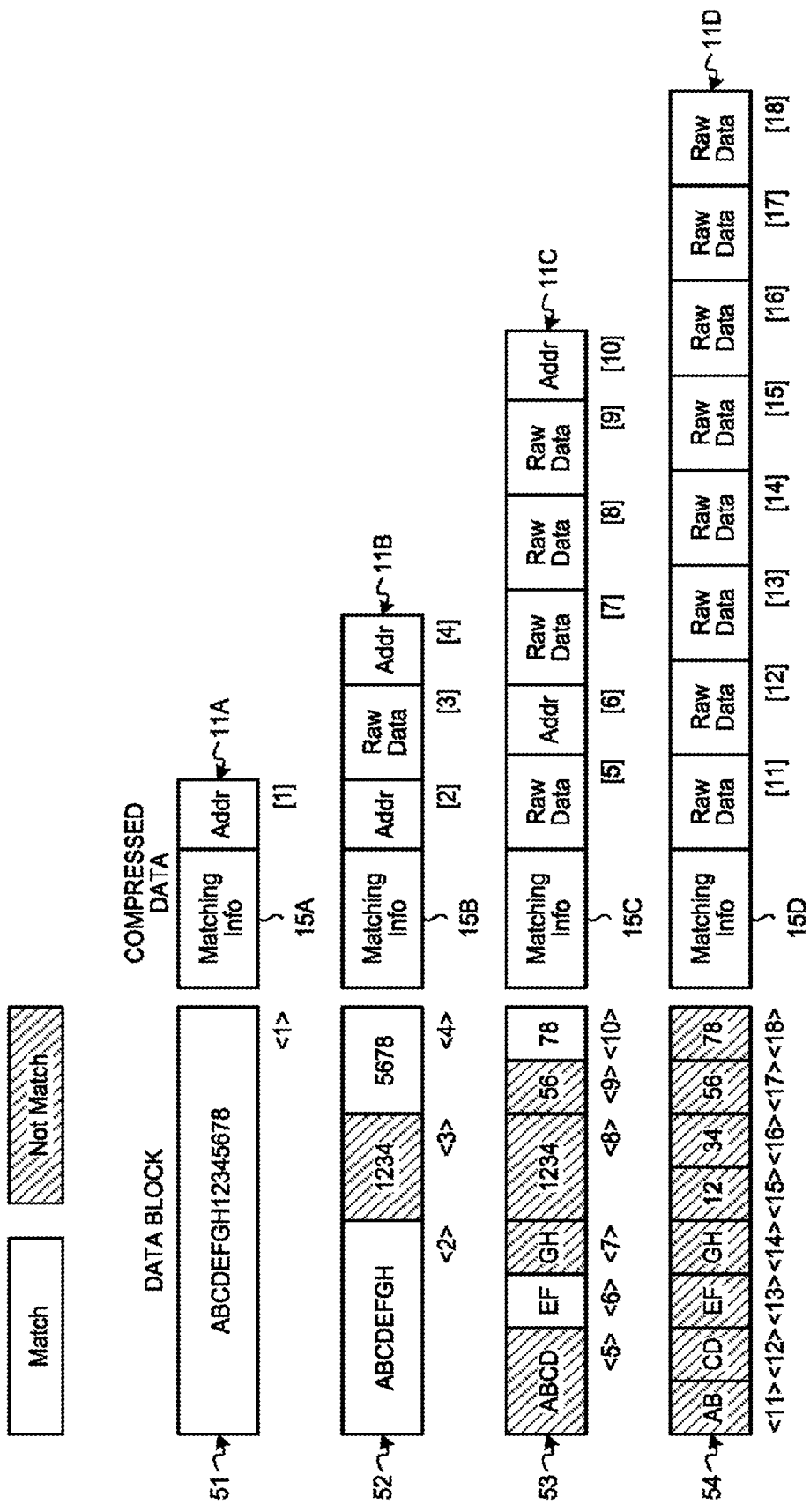
FIG. 3 is a diagram illustrating code structure of compressed data according to the first embodiment.

FIG. 3 is a diagram illustrating code structure of the compressed data 11 (11A to 11D) according to the first embodiment. The figure illustrates four examples. The first example illustrates a code structure of a first compressed data 11A generated from the 16-byte data block 51. The second example illustrates a code structure of a second compressed data 11B generated from the 8-byte data block 52. The third example illustrates a code structure of a third compressed data 11C generated from the 4-byte data block 53. The fourth example illustrates a code structure of a fourth compressed data 11D generated from the 2-byte data block 54. In the data blocks of the figure, empty portions represent matched portions, that is, portions of which the result of determination by the matcher 27 is "having sameness (Match)" among the portions of the input data 10. Hatched portions represent mismatched portions, that is, portions of which the result of determination by the matcher 27 is "having no sameness (Not Match)" among the portions of the input data 10.

In the first example, the entire content data <1>: "ABCDEFGH12345678" in the 16-byte data block 51 is determined as "Match". In this case, the first compressed data 11A is configured with matching information (Matching Info) 15A and an address [1]. The matching information 15A is information representing whether a certain portion in the compressed data 11A is "Match" or "Not Match". In this example, the matching information 15A is information representing that the portion corresponding to the address [1] is "Match". The address [1] is an address representing the storage location on the compression dictionary 40 where the content data <1> is stored. Namely, in this example, the content data <1> which is determined as "Match" is converted into the address [1] to be incorporated into the first compressed data 11A.

In the second example, the entire content data <2>: "ABCDEFGH" in the first 8-byte data block 52A and a partial content data <4>: "5678" in the second 8-byte data block 52B are determined as "Match"; and a partial content data <3>: "1234" in the second 8-byte data block 52B is determined as "Not Match". In this case, the second compressed data 11B is configured with matching information 15B, an address [2], a raw data [3], and an address [4]. In this example, the matching information 15B is information representing that the portions corresponding to the addresses [2] and [4] are "Match", and the portion corresponding to the raw data [3] is "Not Match". The address [2] is an address representing the storage location on the compression dictionary 40 where the content data <2> is stored. The raw data [3] is a data representing the content data <3>: "1234", as it is. The address [4] is an address representing the storage location on the compression dictionary 40 where the content data <4> is stored. Namely, in this example, the content data <2> and <4> which are determined as "Match" are converted into the addresses [2] and [4] to be incorporated into the second compressed data 11B, and the content data <3> which is determined as "Not Match" becomes the raw data [3] to be incorporated into the second compressed data 11B, as it is.

In the third example, a partial content data <6>: "EF" in the second 4-byte data block 53B and a partial content data <10>: "78" in the fourth 4-byte data block 53D are determined as "Match"; and the other content data <5> and <7> to <9> are determined as "Not Match". In this case, the third compressed data 11C is configured with matching information 15C, a raw data [5], an address [6], a raw data [7], a raw data [8], a raw data "9", and an address [10]. In this example, the matching information 15C is information representing that the portions corresponding to the addresses [6] and [10] are "Match", and the portion corresponding to the raw data [5] and [7] to [9] are "Not Match". In this example, the content data <6> and <10> are converted into the addresses [6] and [10] to be incorporated into the third compressed data 11C, and the content data <5> and <7> to <9> become the raw data [5] and [7] to [9] to be incorporated into the third compressed data 11C, as they are.

In the fourth example, the entire content data <11> to <18> in all 2-byte data blocks 54A to 54H are determined as "Not Match". In this case, the fourth compressed data 11D is configured with matching information 15D and raw data [11] to [18]. In this example, the matching information 15D is information representing that the portions corresponding to the raw data [11] to [18] are "Not Match". In this example, the content data <11> to <18> become the raw data [11] to [18] to be incorporated into the fourth compressed data 11D, as they are.

As indicated in the first to fourth examples, each of the compressed data 11A and 11D includes the respective matching information 15A to 15D and at least one of the address and the raw data. The content data <1>, <2>, <4>, <6>, and <10> which are determined as "Match" among the content data included in the data blocks 51 to 54 are converted into the respective addresses [1], [2], [4], [6], and [10] to be incorporated into the respective compressed data 11A to 11D. On the other hand, the content data <3>, <5>, <7>, <8>, <9>, and <11> to <18> become the respective raw data [3], [5], [7], [8], [9], and [11] to [18] which are determined as "Not Match" to be incorporated into the respective compressed data 11A to 11D, as they are. The configuration of the matching information 15A to 15D is not particularly limited, but for example, information or the like where a combination of information representing a position and size of a section which becomes an object in the compressed data 11 and information representing whether or not to be "Match" is indicated by a plurality of bits may be used.

Figure 4:
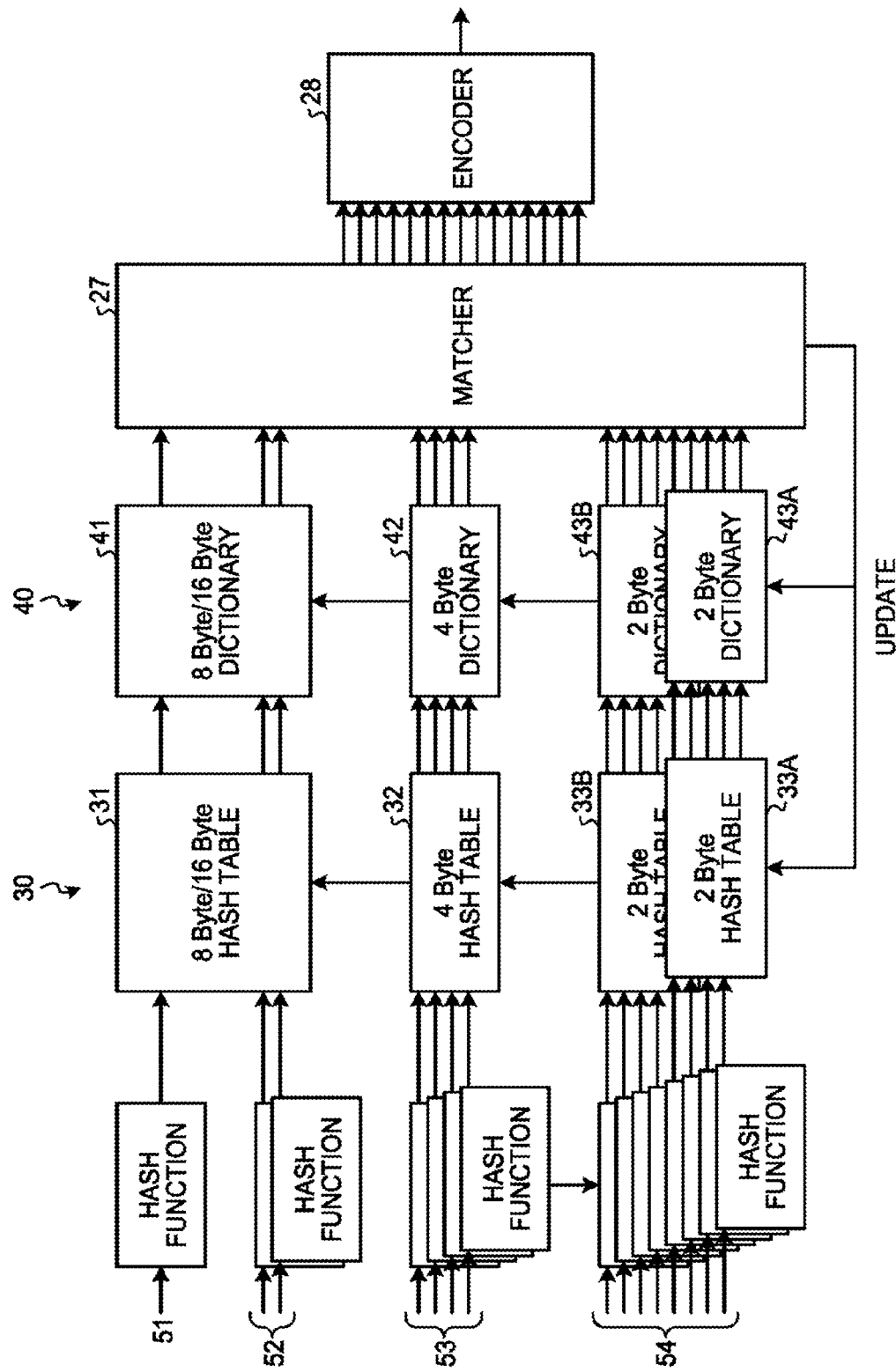
FIG. 4 is a diagram illustrating a configuration of hash tables and compression dictionaries according to the first embodiment.

FIG. 4 is a diagram illustrating a configuration of the hash tables 30 and the compression dictionaries 40 according to the first embodiment. In the figure, one 16-byte data block 51, two 8-byte data blocks 52, four 4-byte data blocks 53, and eight 2-byte data blocks 54 are input to the hash function (hash calculator 22), and each of the data associated with the data blocks 51 to 54 is input to the hash table 30 and the compression dictionary 40.

As the hash tables 30, one 8-byte/16-byte hash table 31, one 4-byte hash table 32, and two 2-byte hash tables 33A and 33B are formed. As the compression dictionaries 40, one 8-byte/16-byte dictionary 41, one 4-byte dictionary 42, and two 2-byte dictionaries 43A and 43B are formed.

The data associated with the one 16-byte data block 51 and the data associated with the two 8-byte data blocks 52 are input to the one 8-byte/16-byte hash table 31 and one 8-byte/16-byte dictionary 41. The data associated with the four 4-byte data blocks 53 are input to the one 4-byte hash table 32 and the one 4-byte dictionary 42. The data associated with the eight 2-byte data blocks 54 are input to the two 2-byte hash tables 33A and 33B and the two 2-byte dictionaries 43A and 43B.

The 8-byte/16-byte hash table 31 is a shared table by a plurality of different data lengths (8 bytes and 16 bytes). Each of the hash tables 31, 32, 33A, and 33B is shared by a plurality of the data blocks 52 to 54 having the same data length (8 bytes, 4 bytes, or 2 bytes).

The 8-byte/16-byte dictionary 41 is a shared dictionary by a plurality of different data lengths (8 bytes and 16 bytes). In addition, each of the compression dictionaries 41, 42, 43A, and 43B is shared by a plurality of the data blocks 52 and 54 having the same data length (8 bytes, 4 bytes, or 2 bytes).

According to the above-described configuration, the number (4) of hash tables 31, 32, 33A, and 33B and the number (4) of compression dictionaries 41, 42, 43A, and 43B are smaller than the total number (15) of data blocks 51 to 54 formed by dividing the one input data 10. Therefore, it is possible to reduce a physical storage area of the hash table memory 23 and the compression dictionary memory 24.

In addition, in FIG. 4, a plurality of arrows corresponding to a plurality of the data blocks 51 to 54 are illustrated so as to be input to each of the hash functions, each of the hash tables 31, 32, 33A, and 44B, and each of the compression dictionaries 41, 42, 43A, and 43B in parallel. However, actually, each of the data blocks 51 to 54 and the data associated with the data blocks are input to each of the hash functions, each of the hash tables 31, 32, 33A, and 44B, and each of the compression dictionaries 41, 42, 43A, and 43B in series.

Figure 5:
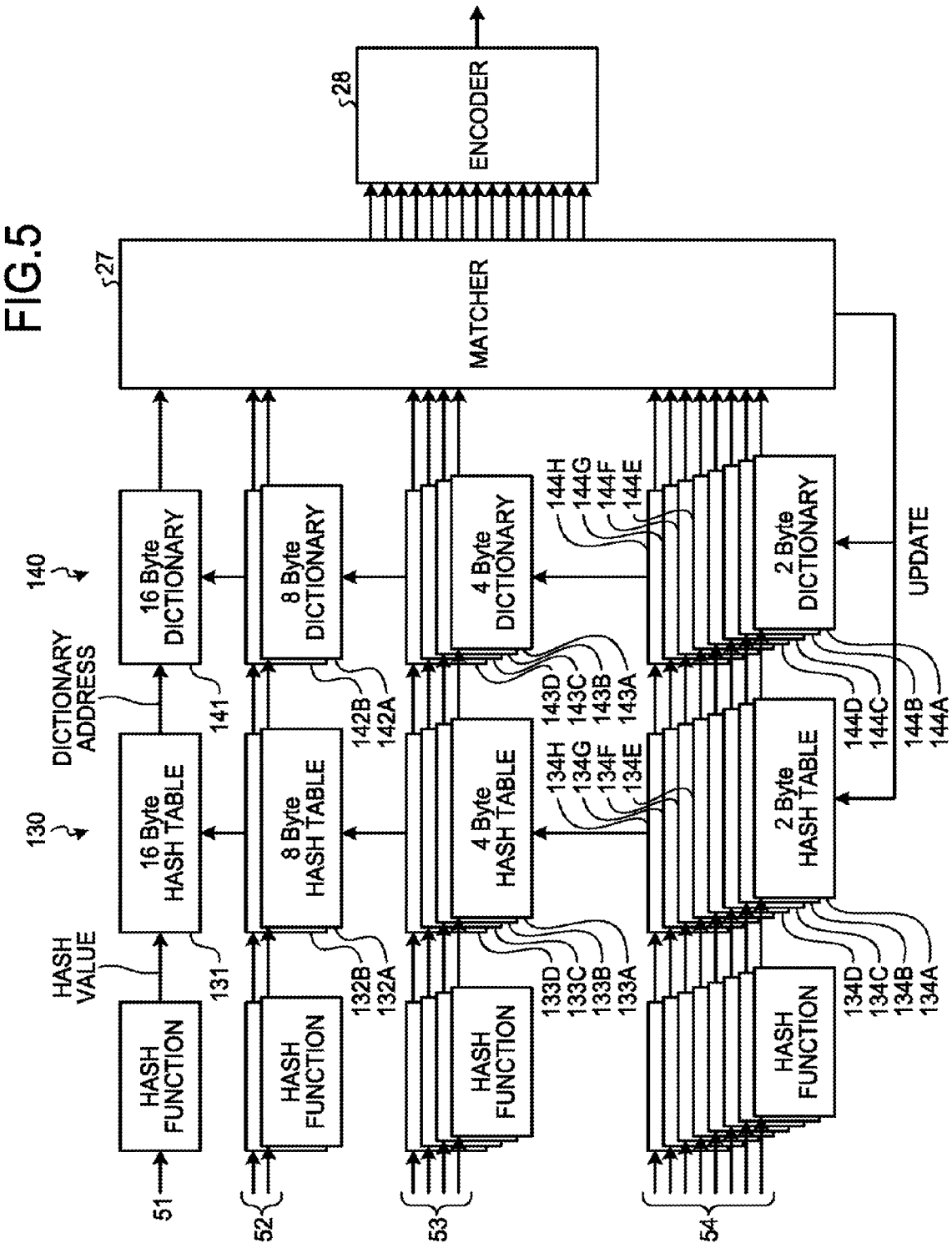
FIG. 5 is a diagram illustrating a configuration of hash tables and compression dictionaries according to Comparative Example.

FIG. 5 is a diagram illustrating a configuration of hash tables 130 and compression dictionaries 140 according to Comparative Example. In this Comparative Example, as the hash tables 130, one 16-byte hash table 131, two 8-byte hash tables 132A and 132B, four 4-byte hash tables 133A to 133D, and eight 2-byte hash tables 134A to 134H are formed. As the compression dictionaries 140, one 16-byte dictionary 141, two 8-byte dictionaries 142A and 142B, four 4-byte dictionaries 143A to 143D, and eight 2-byte dictionaries 144A to 144H are formed.

In this Comparative Example, fifteen hash tables 131, 132A, 132B, 133A to 133D, and 134A to 134H and fifteen compression dictionaries 141, 142A, 142B, 143A to 143D, and 144A to 144H are formed so as to correspond to fifteen data blocks 51 to 54. Furthermore, the entire hash tables 131, 132A, 132B, 133A to 133D, and 134A to 134H are occupied in one data block, and the entire compression dictionaries 141, 142A, 142B, 143A to 143D, and 144A to 144H are occupied in one data block. In such a configuration, there is a huge physical storage area for storing the hash tables 130 and the dictionaries 140.

Figure 6:
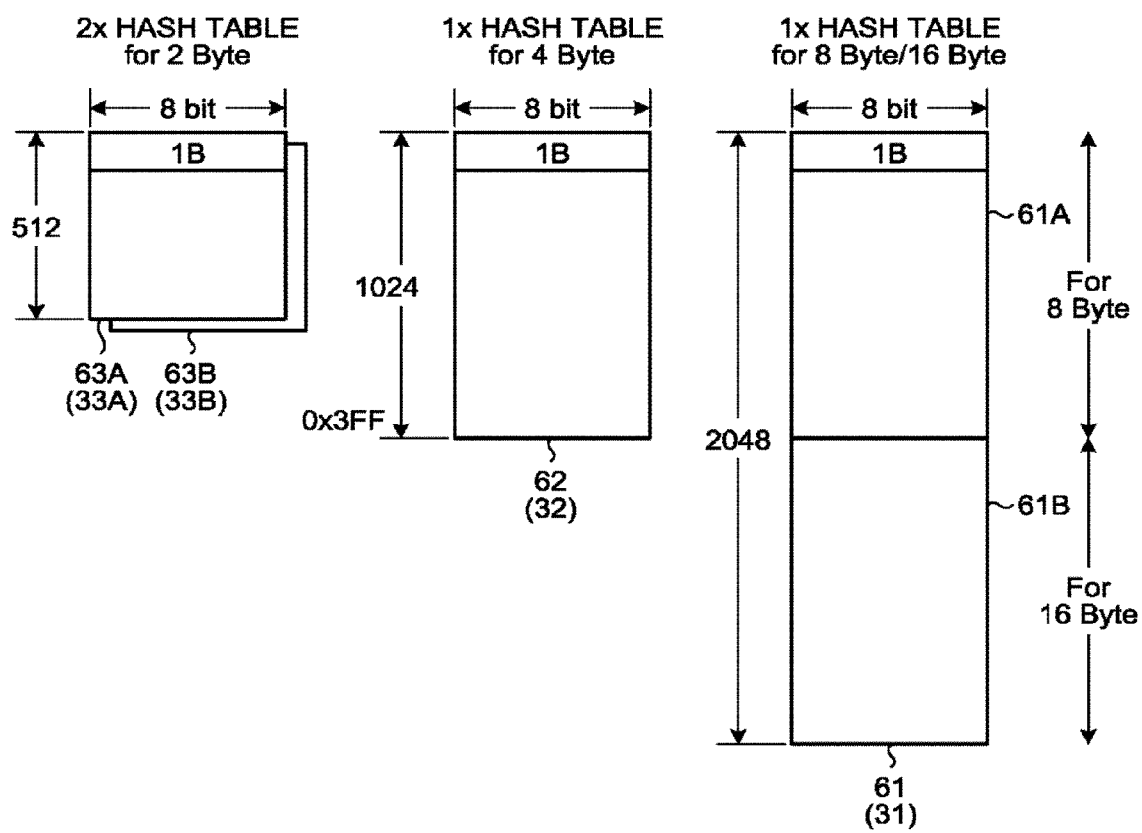
FIG. 6 is a diagram illustrating a memory map of a hash table memory according to the first embodiment.

FIG. 6 is a diagram illustrating a memory map of the hash table memory 23 according to the first embodiment. A first 2-byte hash table area 63A for storing the first 2-byte hash table 33A, a second 2-byte hash table area 63B for storing the second 2-byte hash table 33B, a 4-byte hash table area 62 for storing the 4-byte hash table 32, and an 8-byte/16-byte hash table area 61 for storing the 8-byte/16-byte hash table 31 are formed on the hash table memory 23.

In this example, each entry of all the areas 61, 62, 63A, 63B has a word length of 8 bits (1 byte). Data representing the addresses representing the storage locations of the data blocks 51, 52A, 52B, 53A to 53D, and 54A to 54H corresponding to the hash values are stored in each entry. The word length of each of the areas 61, 62, 63A, and 63B is not limited to 8 bits, but it may be appropriately designed according to the use situation. As the compression dictionary 40 is enlarged, the data amount of the addresses required for specifying the storage locations is also increased. Therefore, the word length may be increased or decreased in accordance with the size of the compression dictionary 40.

In this example, an address range (number of entries) of the 2-byte hash table areas 63A and 63B is 512. The address range of the 4-byte hash table area 62 is 1024. The address range of the 8-byte/16-byte hash table area 61 is 2048 (1024×2). The address range is set in accordance with the size of the compression dictionary 40.

The area of 1024 from the start position to the middle position of the address range of the 8-byte/16-byte hash table area 61 is the 8-byte hash table area 61A for storing the address specifying the storage location of the data block 52 having a data length of 8 bytes. The area of 1024 from the middle position to the end position of the 8-byte/16-byte hash table area 61 is the 16-byte hash table area 61B for storing the address specifying the data block 51 having a data length of 16 bytes. In this manner, the 8-byte/16-byte hash table area 61 is shared by different data lengths (8 bytes and 16 bytes).

Figure 7:
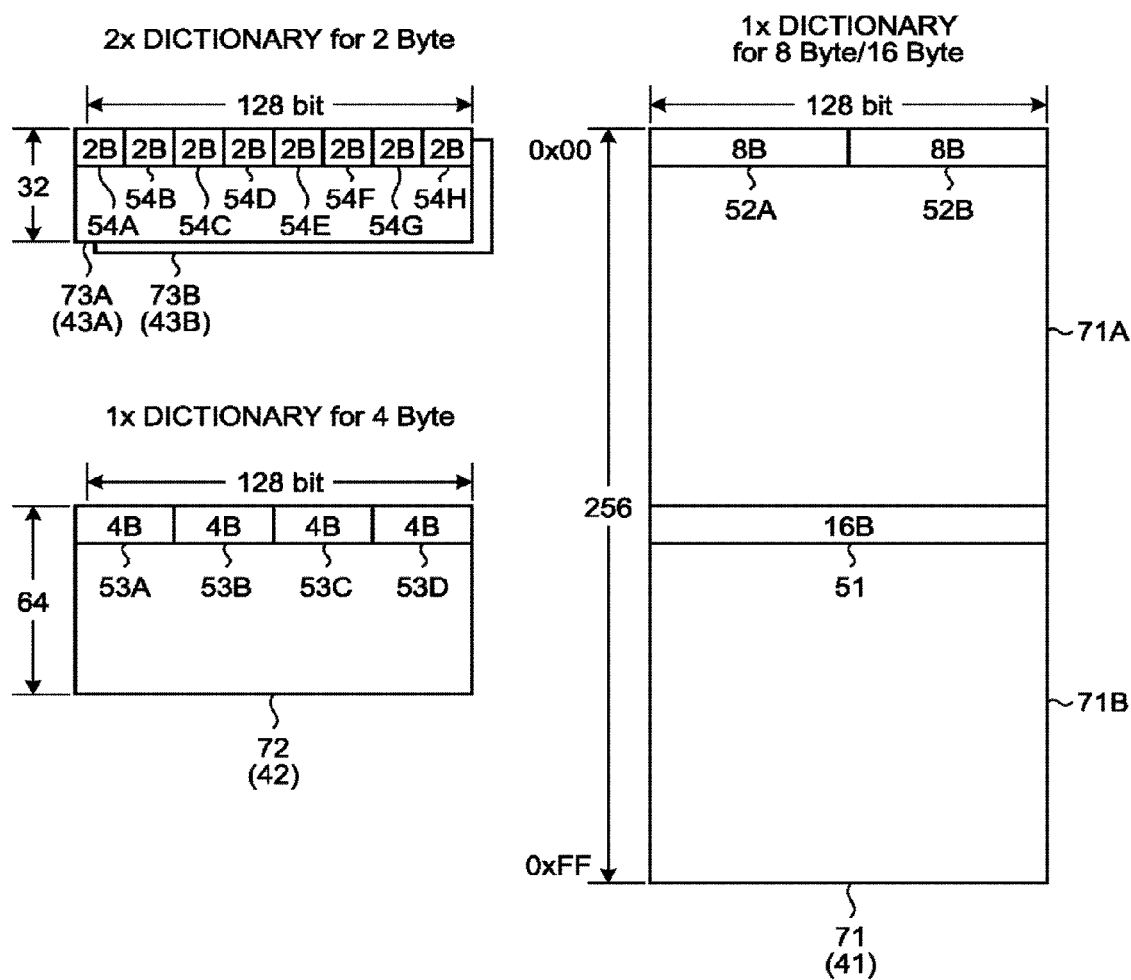
FIG. 7 is a diagram illustrating a memory map of a compression dictionary memory according to the first embodiment.

FIG. 7 is a diagram illustrating a memory map of the compression dictionary memory 24 according to the first embodiment. A first 2-byte dictionary area 73A for storing the first 2-byte dictionary 43A, a second 2-byte dictionary area 73B for storing the second 2-byte dictionary 43B, a 4-byte dictionary area 72 for storing the 4-byte dictionary 42, and an 8-byte/16-byte dictionary area 71 for storing the 8-byte/16-byte dictionary 41 are formed on the compression dictionary memory 24.

In this example, each entry of all the areas 71, 72, 73A, and 73B has a word length of 128 bit (16 bytes) which is the same as the data length of the input data 10. Each of the data blocks 51, 52A, 52B, 53A to 53D, and 54A to 54H are stored in each entry. The word length of each of the areas 71, 72, 73A, and 73B is not necessarily limited to the same word length as that of the input data 10.

In this example, the address range (number of entries) of the 2-byte dictionary areas 73A and 73B is 32. The address range of the 4-byte dictionary area 72 is 64. The address range of the 8-byte/16-byte dictionary area 71 is 256. The address ranges are not limited to the aforementioned address ranges.

The area from the start position to the middle position of the address range of the 8-byte/16-byte dictionary area 71 is the 8-byte dictionary area 71A for storing the data blocks 52A and 52B obtained by dividing the input data 10 by a data length of 8 bytes. The area from the middle point to the end position of the 8-byte/16-byte dictionary area 71 is the 16-byte dictionary area 71B for storing the data block 51 having the same data length as that of the input byte 10. In this manner, the 8-byte/16-byte dictionary area 71 is shared by different data lengths (8 bytes and 16 bytes). The entry address of the 8-byte dictionary area 71A and the entry address of the 16-byte dictionary area 71B may be consecutively allocated (in this example, 0x00 to 0xFF). The word length of the 8-byte dictionary area 71A is the same as the word length of the 16-byte dictionary area 71B (in this example, 128 bits).

Figure 8:
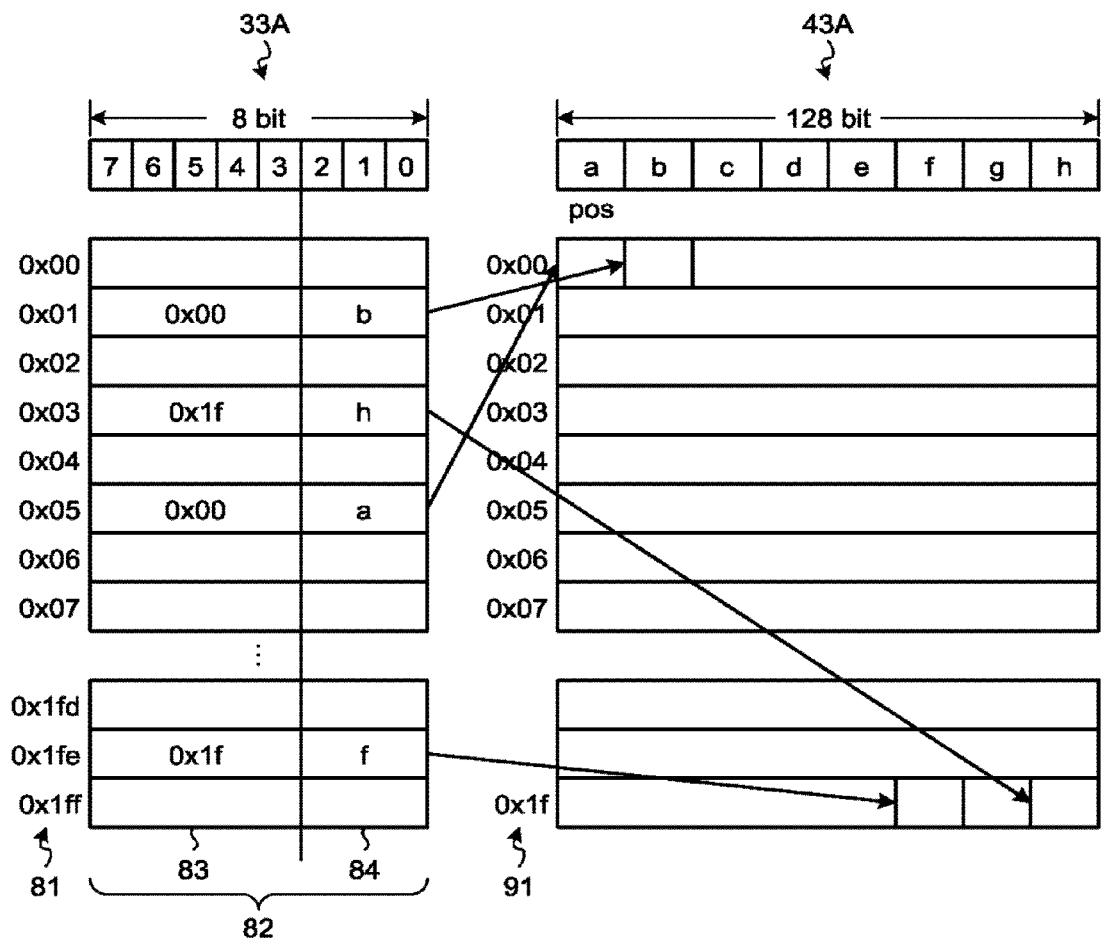
FIG. 8 is a diagram illustrating address conversion in a 2-byte data block according to the first embodiment.

FIG. 8 is a diagram illustrating address conversion in the 2-byte data block 54 according to the first embodiment. This figure illustrates the first 2-byte hash table 33A and the first 2-byte dictionary 43A.

An entry address 81 may be allocated to each entry of the first 2-byte hash table 33A. Each entry address 81 uniquely corresponds to the hash value calculated by the hash calculator 22. An address 82 representing the storage location on the first 2-byte dictionary 43A is stored in each entry of the first 2-byte hash table 33A.

The address 82 includes dictionary entry information 83 and offset information 84. The dictionary entry information 83 is information representing an entry address 91 of the first 2-byte dictionary 43A, and in this example, 5-bit MSB (Most Significant Bit) is needed in order to distinguish 32 entries. The offset information 84 is information representing offset in a word direction in each entry of the first 2-byte dictionary 43A, and in this example, 3-bit LSB (Least Significant Bit) is needed in order to distinguish eight types (a to h) of offset.

In this example, dictionary entry information 83 "0x00" and offset information 84 "b" are stored in the entry allocated with the entry address 81 "0x01", dictionary entry information 83 "0x1f" and offset information 84 "h" are stored in the entry allocated with the entry address 81 "0x03", dictionary entry information 83 "0x00" and offset information 84 "a" are stored in the entry allocated with the entry address 81 "0x05", and dictionary entry information 83 "0x1f" and offset information 84 "f" are stored in the entry allocated with the entry address 81 "0x1fe". By referring to the first 2-byte hash table 33A, the storage location of the 2-byte data block 54 corresponding to the hash value on the 2-byte dictionary 43 can be specified. With respect to the relationship between the second 2-byte hash table 33B and the second 2-byte dictionary 43B, the same configuration is used.

In the 4-byte hash table 32, since the number of entries of the 4-byte dictionary 42 is 64 and there are four types of offset, similarly to the 2-byte hash tables 33A and 33B, the dictionary entry information 83 may be set to 5 bits, and the offset information 84 may be set to 3 bits.

In the 8-byte/16-byte hash table 31, since it is preferable to distinguish two types of offset of the 8-byte data blocks 52A and 52B, 1 bit of the offset information 84 is sufficient. By allocating the remaining 7 bit to the dictionary entry information 83, 128 entries that is half of the total 256 entries of the 8-byte/16-byte dictionary 41 can be distinguished. The above-described configuration can be applied to a cyclic storage mechanism.

Figure 9:
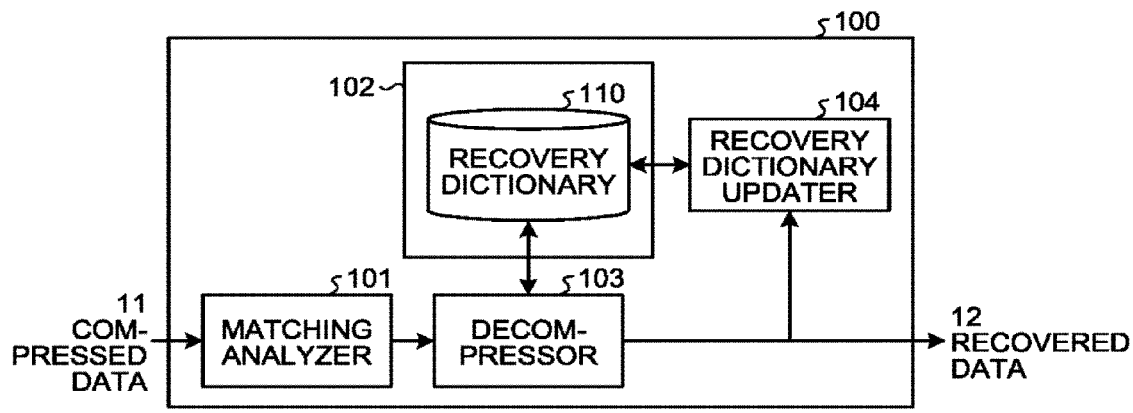
FIG. 9 is a diagram illustrating a configuration of a recoverer according to the first embodiment.

FIG. 9 is a diagram illustrating a recoverer 100 according to the first embodiment. The recoverer 100 generates the recovered data 12 by decompressing the compressed data 11 generated by the compressor 20. The recoverer 100 may be included in the data compression system 1.

The recoverer 100 is configured to include a matching analyzer 101, a recovery dictionary memory 102 (second dictionary memory), a decompressor 103, and a recovery dictionary updater 104 (second updater).

The matching analyzer 101 analyzes positions of "Match" and "Not Match" in each compressed data 11 based on the matching information 15A to 15D included in the compressed data 11. The data corresponding to the position of "Match" in the compressed data 11 is a data formed by converting the raw data of the input data 10 to an address. The data corresponding to the position of "Not Match" in the compressed data 11 is a data formed by copying the raw data of the input data 10, as it is.

The recovery dictionary memory 102 is a memory which stores a recovery dictionary 110 storing previous recovered data 12.

The decompressor 103 decompresses the compressed data 11 by converting the data (address) corresponding to the position of "Match" analyzed by the matching analyzer 101 to the original input data 10 (raw data) based on the recovery dictionary 110 to generate the recovered data 12.

The recovery dictionary updater 104 updates the recovery dictionary 110 based on a new recovered data 12. At this time, the recovery dictionary updater 104 updates the recovered data 12 by using information such as the raw data and the address acquired from the matching analyzer 101.

Figure 10:
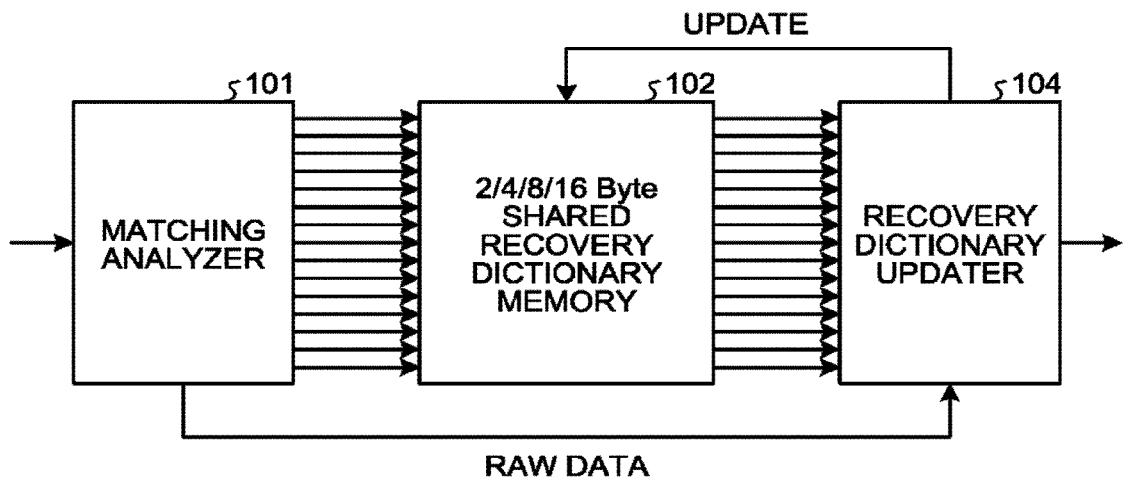
FIG. 10 is a diagram illustrating a configuration of a recovery dictionary memory according to the first embodiment.
Figure 11:
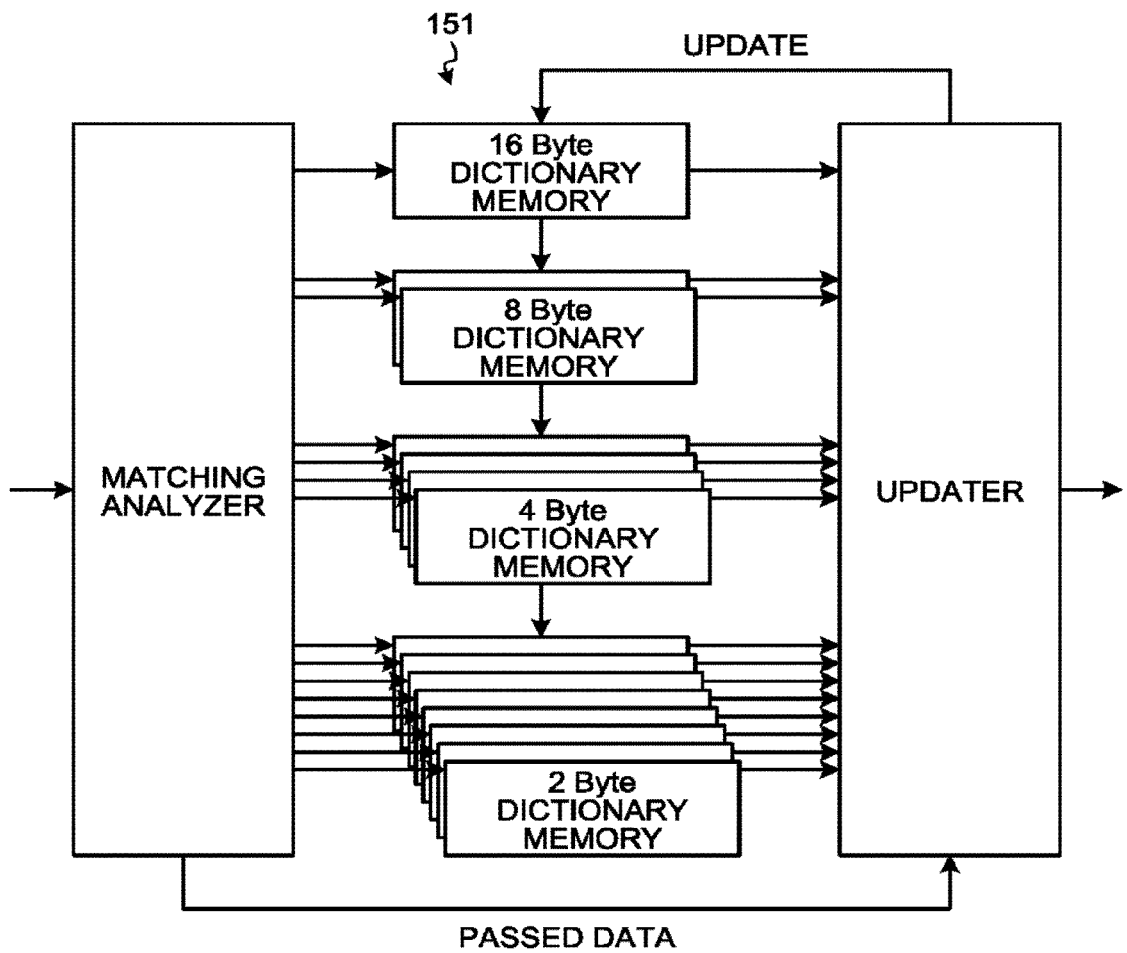
FIG. 11 is a diagram illustrating a configuration of recovery dictionary memories according to Comparative Example.

FIG. 10 is a diagram illustrating a configuration of the recovery dictionary memory 102 according to the first embodiment. FIG. 11 is a diagram illustrating a configuration of recovery dictionary memories 151 according to Comparative Example. The recovery dictionary memory 102 according to the embodiment illustrated in FIG. 10 is shared by all the data blocks. The recovery dictionary memories 151 according to Comparative Example illustrated in FIG. 11 are provided so as to correspond to the respective data blocks. Whereas the total number of recovery dictionary memories 151 according to Comparative Example is 15 (one 16-byte dictionary memory, two 8-byte dictionary memories, four 4-byte dictionary memories, and eight 2-byte dictionary memories), in the embodiment, there is one recovery dictionary memory 102.

A program implementing various functions of the above-described data compression system 1 may be provided as a file in an installable format file or an executable format which is recorded in a computer-readable recording medium such as a CD-ROM, a flexible disk (FD), a CD-R, or a DVD. The program may be downloaded from a predetermined storage device connected to a network to a predetermined information processing device to be provided. Alternatively, the program incorporated into a ROM or the like in advance may be provided to a predetermined information processing device. The program may be configured with a plurality of modules implementing the above-described various functions.

As described above, according to the embodiment, the shared table (8-byte/16-byte hash table 31) and the shared dictionary (8-byte/16-byte dictionary 41) shared by different data lengths are formed. Each of the hash tables 31, 32, 33A, and 33B and each of the compression dictionaries 41, 42, 43A, and 43B are shared by a plurality of the data blocks 52 to 54 having the same data length (8 bytes, 4 bytes, or 2 bytes). Therefore, the number (4) of hash tables 30 and the number (4) of compression dictionaries 40 become smaller than the total number (15) of data blocks 51 to 54 formed by dividing one input data 10. Accordingly, it is possible to improve performance without increasing the physical storage area of the hash table memory 23 and the compression dictionary memory 24.

Hereinafter, other embodiments will be described with reference to the drawings. The components exhibiting the same or similar functions and effects as those of the first embodiment are denoted by the same reference numerals, and in some cases, the description thereof is omitted.

Second Embodiment

Figure 12:
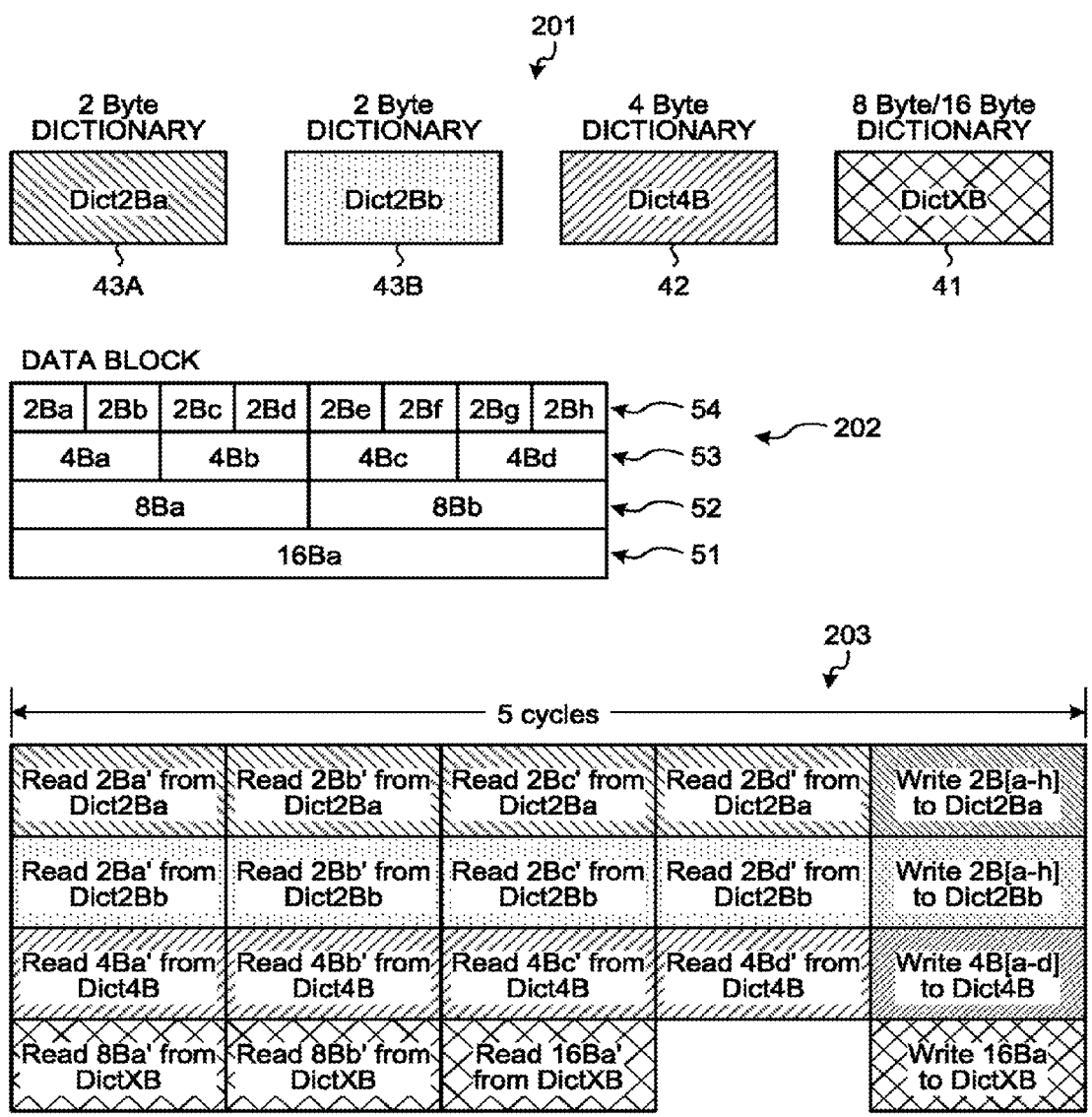
FIG. 12 is a diagram illustrating the number of cycles required for a read/write process in a data compression system according to a second embodiment.

FIG. 12 is a diagram illustrating the number of cycles required for a read/write process in a data compression system 1 according to a second embodiment. In the figure, a dictionary configuration 201, a data block configuration 202, and a read/write cycle 203 are conceptually illustrated.

Herein, a first 2-byte dictionary 43A is referred to as a "Dict2Ba", a second 2-byte dictionary 43B is referred to as a "Dict2Bb", a 4-byte dictionary 42 is referred to as a "Dict4B", and an 8-byte/16-byte dictionary 41 is referred to as a "DictXB". A 16-byte data block 51 is referred to as a "16Ba", two 8-byte data blocks 52 are referred to as "8Ba" and "8Bb", four 4-byte data blocks 53 are referred to as "4Ba", "4Bb", "4Cb", and "4Bb", and eight 2-byte blocks 54 are referred to as "2Ba", "2Bb", "2Bc", "2Bd", "2Be", "2Bf", "2Bg", and "2Bh".

In the embodiment, as illustrated in the read/write cycle 203, all the read/write processes are completed within five cycles. In the read/write processes of the 4-byte data block 53 and the 2-byte data block 54, four cycles are needed for reading data from each of the dictionaries 42, 43A, and 43B, and one cycle is needed for updating each of the dictionaries 42, 43A, and 43B. In this manner, the data compression system 1 according to the embodiment is configured so that the number of times of the read/write processes is a predetermined number of cycles or less.

Figure 13:
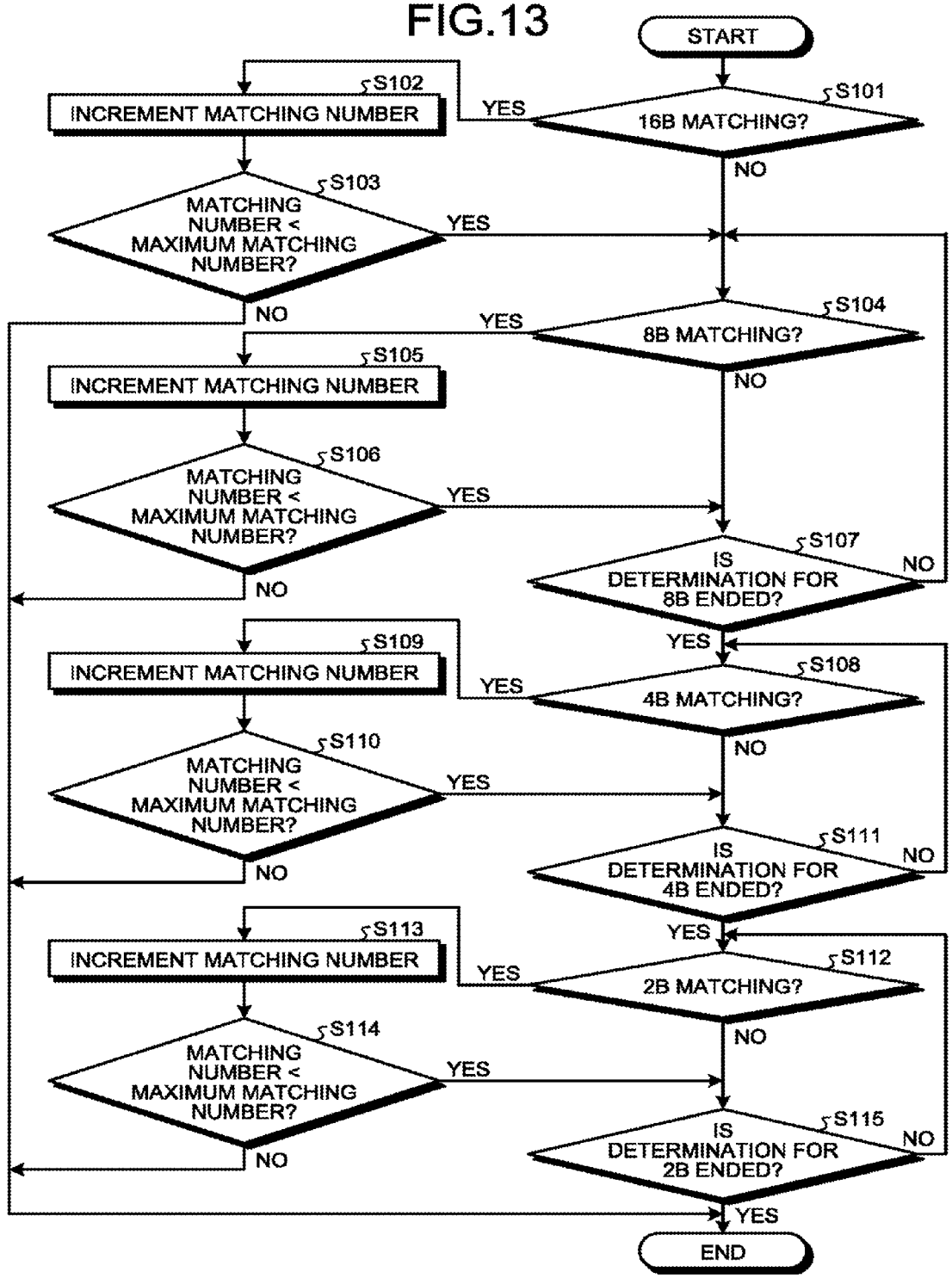
FIG. 13 is a flowchart illustrating a flow of a sameness determination process in the data compression system according to the second embodiment.

FIG. 13 is a flowchart illustrating a flow of a sameness determination process in the data compression system 1 according to the second embodiment. First, the matcher 27 determines the sameness of the 16-byte data block 51 of a new input data 10 (S101). In the case where the sameness is accepted in step S101 (Yes), a matching number is incremented (S102), and it is determined whether or not the matching number is smaller than a predetermined maximum matching number (S103). In the cases where the matching number is not smaller than the maximum matching number (S103: No), the sameness determination process is ended, and after that, the updater 25 updates (write process) the compression dictionary 40.

In the case where the matching number is smaller than the maximum matching number in step S103 (Yes), the sameness determination is performed on one of the 8-byte data blocks 52 (S104). In the case where the sameness is accepted in step S104 (Yes), the matching number is incremented (S105), and it is determined whether or not the matching number is smaller than the maximum matching number (S106). In the case where the matching number is not smaller than the maximum matching number (S103: No), the sameness determination process is ended. In the case where the matching number is smaller than the maximum matching number (S103: Yes), it is determined whether or not the sameness determination on all the 8-byte data blocks 52 is ended (S107).

In the case where the determination is not ended in step S107 (No), the procedure returns to step S104. In the case where the determination is ended (Yes), the sameness determination is performed on one of the 4-byte data blocks 53 (S108). In the case where the sameness is accepted in step S108 (Yes), the matching number is incremented (S109), and it is determined whether or not the matching number is smaller than the maximum matching number (S110). In the case where the matching number is not smaller than the maximum matching number (S110: No), the sameness determination process is ended. In the case where the matching number is smaller than the maximum matching number (S110: Yes), it is determined whether or not the sameness determination on all the 4-byte data blocks 53 is ended (S111).

In the case where the determination is not ended in step S111 (No), the procedure returns to step S108. In the case where the determination is ended (Yes), the sameness determination is performed on one of the 2-byte data blocks 54 (S112). In the case where the sameness is accepted in step S112 (Yes), the matching number is incremented (S113), and it is determined whether or not the matching number is smaller than the maximum matching number (S114). In the case where the matching number is not smaller than the maximum matching number (S114: No), the sameness determination process is ended. In the case where the matching number is smaller than the maximum matching number (S114: Yes), it is determined whether or not the sameness determination on all the 2-byte data blocks 54 is ended (S115).

Due to the sameness determination process described above, it is possible to prevent the number of cycles of the read/write process from being larger than the maximum matching number. Therefore, the substantially unnecessary sameness determination process is suppressed, so that it is possible to maintain good throughput.

Third Embodiment

Figure 14:
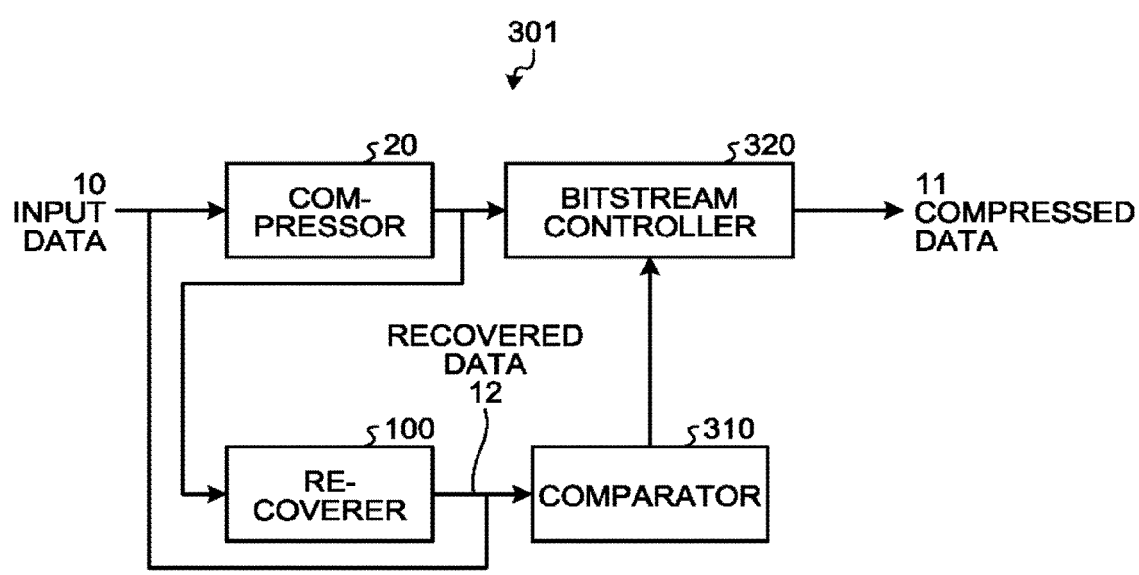
FIG. 14 is a diagram illustrating a configuration of a data compression system according to a third embodiment.

FIG. 14 is a diagram illustrating a configuration of a data compression system 301 according to a third embodiment. The data compression system 301 is configured to include a compressor 20, a recoverer 100, a comparator 310, and a bitstream controller 320.

The comparator 310 compares an input data 10 and a recovered data 12 outputs from the recoverer 100.

The bitstream controller 320 controls an output of the compressed data 11 as a bitstream output from the compressor 20 based on a result of the comparison by the comparator 310. In the case where occurrence of error (mismatch between the input data 10 and a recovered data 12) is sensed by the comparator 310, the bitstream controller 320 may stop outputting the compressed data 11 or may output a compressed data added with error information.

According to the configuration described above, quality of the compressed data 11 is verified in real time, and thus, it is possible to speedily cope with occurrence of problem.

Fourth Embodiment

Figure 15:
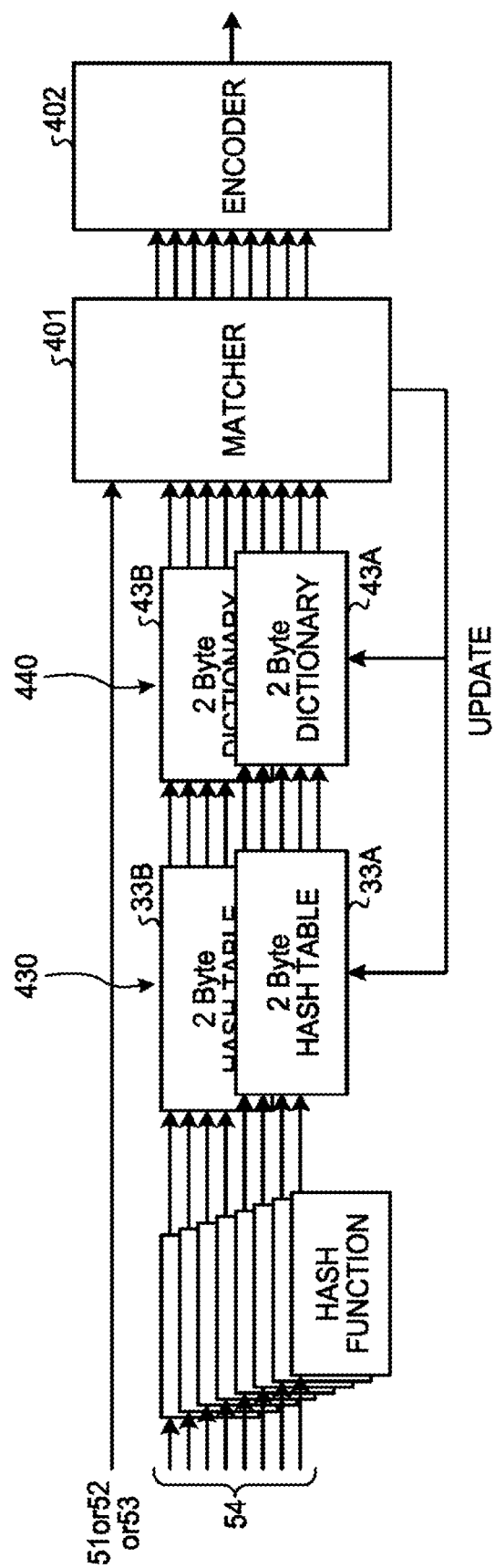
FIG. 15 is a diagram illustrating a configuration of hash tables and compression dictionaries according to a fourth embodiment.

FIG. 15 is a diagram illustrating a configuration of hash tables 430 and compression dictionaries 440 according to a fourth embodiment. The hash table 430 is configured with a first 2-byte hash table 33A and a second 2-byte hash table 33B. The compression dictionary 440 is configured with a first 2-byte dictionary 43A and a second 2-byte dictionary 43B. A matcher 401 determines the sameness by comparing a new 2-byte data block 54 and previous 2-byte data blocks 54 stored at storage locations indicated by addresses acquired by the 2-byte hash tables 33A and 33B and also by comparing the new 2-byte data block 54 and data bocks having different data lengths (for example, 4 bytes, 8 bytes, or 16 bytes).

According to such a configuration, it is possible to improve performance without increasing a physical storage area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data compression system comprising:
   a divider configured to divide an input data into a plurality of data blocks having plural types of data lengths;
   a hash calculator configured to calculate a hash value of each data block;
   a first dictionary memory configured to store a first dictionary that stores a previous input data for each data block and includes a shared dictionary shared by different data lengths;
   a hash table memory configured to store a hash table that stores an address representing a storage location of the data block corresponding to the hash value on the first dictionary for each data block and includes a shared table shared by different data lengths;
   a first updater configured to update the first dictionary based on a new input data and update the address of the hash table based on the new input data and the updated first dictionary;
   an address acquirer configured to acquire the address corresponding to the data block obtained by dividing the new input data based on the hash table;
   a matcher configured to determine sameness between the previous data block stored at the storage location indicated by the acquired address and each portion of the new input data; and
   an encoder configured to generate a compressed data including matching information representing a result of determination of the sameness, the compressed data in which a matched portion determined to have the sameness is converted to the address.

2. The data compression system according to claim 1, wherein
   the shared dictionary includes a first area corresponding to a first data length and a second area corresponding to a second data length being smaller than the first data length,
   an entry address of the first area and an entry address of the second area are consecutively allocated,
   a word length of the first area is equal to that of the second area, and
   the address includes dictionary entry information representing the entry address and offset information representing offsets in word directions of the first area and the second area.

3. The data compression system according to claim 1, wherein
   the first dictionary is shared by a plurality of the data blocks having the same data length, and
   the hash table is shared by a plurality of the data blocks having the same data length.

4. The data compression system according to claim 1, wherein the matcher performs determining the sameness such that the same number does not exceed a setting value.

5. The data compression system according to claim 1, further comprising a recoverer configured to recover the compressed data to generate a recovered data.

6. The data compression system according to claim 5, wherein the recoverer includes:
   a matching analyzer configured to analyze the matched portion in the compressed data based on the matching information;
   a second dictionary memory configured to store a second dictionary storing the previous recovered data;
   a decompressor configured to generate the recovered data by converting the address corresponding to the analyzed matched portion to a raw data of the input data based on the second dictionary; and
   a second updater configured to update the second dictionary based on the new recovered data.

7. The data compression system according to claim 5, further comprising:

a comparator configured to compare the input data and the recovered data; and an output controller configured to control an output of the compressed data according to a result of comparison.

8. A data compression method comprising:

dividing an input data into a plurality of data blocks having plural types of data lengths;

calculating a hash value of each data block;

storing a first dictionary that stores a previous input data for each data block and includes a shared dictionary shared by different data lengths into a first dictionary memory;

storing a hash table that stores an address representing a storage location of the data block corresponding to the hash value on the first dictionary for each data block and includes a shared table shared by different data lengths into a hash table memory;

updating the first dictionary based on a new input data;

updating the address of the hash table based on the new input data and the updated first dictionary;

acquiring the address corresponding to the data block obtained by dividing the new input data based on the hash table;

determining sameness between the previous data block stored at the storage location indicated by the acquired address and each portion of the new input data; and generating a compressed data including matching information representing a result of determination of the sameness, the compressed data in which a matched portion determined to have the sameness is converted to the address.

* * * * *